United States Patent
Huang et al.

(10) Patent No.: US 9,898,421 B2
(45) Date of Patent: Feb. 20, 2018

(54) MEMORY ACCESS PROCESSING METHOD, MEMORY CHIP, AND SYSTEM BASED ON MEMORY CHIP INTERCONNECTION

(71) Applicant: Huawei Technologies Co., Ltd., Shenzhen (CN)

(72) Inventors: Yongbing Huang, Beijing (CN); Mingyu Chen, Beijing (CN); Yuan Ruan, Beijing (CN); Licheng Chen, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/751,368

(22) Filed: Jun. 26, 2015

(65) Prior Publication Data
US 2015/0293859 A1 Oct. 15, 2015

Related U.S. Application Data

(63) Continuation of application No. PCT/CN2013/084257, filed on Sep. 26, 2013.

(30) Foreign Application Priority Data

Dec. 28, 2012 (CN) .......................... 2012 1 0587401

(51) Int. Cl.
*G06F 12/02* (2006.01)
*G06F 12/14* (2006.01)
(Continued)

(52) U.S. Cl.
CPC ........ *G06F 12/1458* (2013.01); *G06F 3/0622* (2013.01); *G06F 3/0635* (2013.01);
(Continued)

(58) Field of Classification Search
CPC ............. G06F 12/1458; G06F 13/1642; G06F 3/0622; G06F 3/0635; G06F 3/0683;
(Continued)

(56) References Cited

U.S. PATENT DOCUMENTS 6,434,656 B1 * 8/2002 Downer ............ G06F 15/17381
709/238
7,596,647 B1 * 9/2009 Van Dyke ............. G06F 13/364
710/116
(Continued)

FOREIGN PATENT DOCUMENTS

| CN | 1787110 A | 6/2006 |
|---|---|---|
| CN | 1804823 A | 7/2006 |

(Continued)

OTHER PUBLICATIONS

Foreign Communication From a Counterpart Application, European Application No. 13869490.6, Extended European Search Report dated Oct. 27, 2015, 7 pages.
(Continued)

*Primary Examiner* — Arpan P. Savla
(74) *Attorney, Agent, or Firm* — Conley Rose, P.C.

(57) ABSTRACT

A memory access processing method is based on memory chip interconnection, a memory chip, and a system, which relate to the field of electronic devices, and can shorten a time delay in processing a memory access request and improve a utilization rate of system bandwidth. The method of the present disclosure includes receiving, by a first memory chip, a memory access request; and if the first memory chip is not a target memory chip corresponding to the memory access request, sending, according to a preconfigured routing rule, the memory access request to a next memory chip connected with the first memory chip, until the target memory chip corresponding to the memory access request is determined. Embodiments of the present disclo- (Continued)

sure are mainly used in a process of processing a memory access request.

18 Claims, 6 Drawing Sheets

(51) Int. Cl.
  *G06F 3/06* (2006.01)
  *G06F 13/16* (2006.01)
  *G11C 7/10* (2006.01)

(52) U.S. Cl.
  CPC ........ *G06F 3/0683* (2013.01); *G06F 13/1642* (2013.01); *G11C 7/1003* (2013.01); *G06F 2212/1016* (2013.01); *G06F 2212/1052* (2013.01); *G11C 7/1075* (2013.01)

(58) Field of Classification Search
  CPC ..... G06F 2212/1052; G06F 2212/1016; G11C 7/1003; G11C 7/1075
  See application file for complete search history.

(56) References Cited

U.S. PATENT DOCUMENTS

| | | | | |
|---|---|---|---|---|
| 7,957,398 | B1* | 6/2011 | Yochai | G06F 3/0613 370/395.42 |
| 2003/0177296 | A1* | 9/2003 | Kurth | G06F 13/3625 710/244 |
| 2003/0217177 | A1* | 11/2003 | Gulati | H04L 49/252 709/238 |
| 2008/0016254 | A1* | 1/2008 | Kruger | G06F 13/1657 709/251 |
| 2008/0031076 | A1 | 2/2008 | Bartley et al. | |
| 2008/0104340 | A1* | 5/2008 | Shih | G06F 13/161 711/154 |
| 2009/0282176 | A1 | 11/2009 | Ting | |
| 2009/0282191 | A1* | 11/2009 | Depta | G06F 3/061 711/113 |
| 2010/0180070 | A1* | 7/2010 | Kim | G06F 13/128 711/103 |
| 2011/0252162 | A1 | 10/2011 | Li et al. | |
| 2013/0086336 | A1* | 4/2013 | Canepa | G06F 3/0683 711/154 |

FOREIGN PATENT DOCUMENTS

| | | |
|---|---|---|
| CN | 101669096 A | 3/2010 |
| CN | 102033912 A | 4/2011 |
| CN | 102289417 A | 12/2011 |
| JP | 2002123420 A | 4/2002 |

OTHER PUBLICATIONS

Partial English Translation and Abstract of Chinese Patent Application No. CN102289417A, May 18, 2015, 7 pages.
Foreign Communication From a Counterpart Application, PCT Application No. PCT/CN2013/084257, English Translation of International Search Report dated Dec. 26, 2013, 2 pages.
Foreign Communication From a Counterpart Application, PCT Application No. PCT/CN2013/084257, English Translation of Written Opinion dated Dec. 26, 2013, 13 pages.
Partial English Translation and Abstract of Chinese Patent Application No. CN102033912, Apr. 27, 2011, 11 pages.
Partial English Translation and Abstract of Japanese Patent Application No. JP2002123420, Apr. 26, 2002, 11 pages.

\* cited by examiner

MEMORY ACCESS PROCESSING METHOD, MEMORY CHIP, AND SYSTEM BASED ON MEMORY CHIP INTERCONNECTION

CROSS-REFERENCE TO RELATED APPLICATION

This application is a continuation of International Patent Application No. PCT/CN2013/084257, filed on Sep. 26, 2013, which claims priority to Chinese Patent Application No. 201210587401.2, filed on Dec. 28, 2012, both of which are hereby incorporated by reference in their entireties.

TECHNICAL FIELD

The present disclosure relates to the field of electronic devices, and in particular, to a memory access processing method, a memory chip, and a system based on memory chip interconnection.

BACKGROUND

With the rapid development of processor techniques, an existing memory system is insufficient to match a processor system that has undergone rapid development, which causes an increasingly severe development bottleneck for memory techniques. The development bottleneck for memory techniques is mainly reflected in two aspects that include a low effective utilization rate of a memory bandwidth and high power consumption of a memory system.

In a related art, to lower power consumption of a memory system, an organization manner of a memory chip is changed to improve a processing manner of a memory access request. One memory access request is processed by one subarray in one memory chip, instead of being evenly distributed to all memory chips or all subarrays of one memory chip, so that when a memory access request is processed, only a memory chip relevant to the memory access request is activated while other subarrays that are not activated are in a low power consumption mode.

In the forgoing implementation process for processing the memory access, a longer time is needed to transmit data when one memory access request is processed by one subarray in one memory chip and a memory controller can send a next memory access request to the memory chip only after receiving response information returned from the memory chip. This results in a relatively long time delay in processing a memory access request.

SUMMARY

A memory access processing method based on memory chip interconnection, a memory chip, and a system provided in the embodiments of the present disclosure can shorten a time delay in processing a memory access request and improve a utilization rate of system bandwidth.

To achieve the foregoing objectives, the embodiments of the present disclosure use the following technical solutions.

According to a first aspect, an embodiment of the present disclosure provides a memory access processing method based on memory chip interconnection, which includes implementing, by a first memory chip, a process comprising receiving a memory access request; and if the first memory chip is not a target memory chip corresponding to the memory access request, sending, according to a preconfigured routing rule and through a chip interconnect interface disposed on the first memory chip, the memory access request to a second memory chip connected with the chip interconnect interface; the second memory chip is taken as the first memory chip for implementing the process, until the target memory chip corresponding to the memory access request is determined.

With reference to the first aspect, in a possible implementation manner, the receiving, by a first memory chip, a memory access request includes receiving, through a high-speed bus interface, the memory access request sent by a memory controller; or receiving, through a chip interconnect interface, the memory access request sent by the second memory chip.

With reference to the first aspect or any one of the foregoing possible implementation manner, in another possible implementation manner, after the receiving, by a first memory chip, a memory access request, the method further includes if the first memory chip is the target memory chip corresponding to the memory access request, performing a memory access operation corresponding to the memory access request.

With reference to the first aspect or any one of the foregoing possible implementation manners, in another possible implementation manner, before the performing a memory access operation corresponding to the memory access request, the method further includes when the first memory chip is in a busy state, caching the memory access request received from the second memory chip; and when the first memory chip leaves the busy state, reading the cached memory access request.

With reference to the first aspect or any one of the foregoing possible implementation manners, in another possible implementation manners, the memory access request includes a data interaction instruction for instructing interaction between an interaction memory chip and the target memory chip and further indicating memory service data to be interacted between the interaction memory chip and the target memory chip; and the performing a memory access operation corresponding to the memory access request includes transmitting, according to a preconfigured routing rule and through the chip interconnect interface, the memory service data indicated by the data interaction instruction to between the interaction memory chip and the target memory chip.

With reference to the first aspect and the foregoing possible implementation manners, in another possible implementation manner, the memory access request sent by the memory controller includes a primary memory access request received by the memory controller; and/or one of at least two secondary memory access requests that are divided from the primary memory access request.

According to a second aspect, an embodiment of the present disclosure further provides a memory chip, which includes a receiving unit configured to receive a memory access request; at least one chip interconnect interface configured to be connected to another memory chip; and a sending unit configured to, when the memory chip is not a target memory chip corresponding to the memory access request, send, according to a preconfigured routing rule and through a chip interconnect interface, the memory access request to another memory chip connected with the chip interconnect interface.

With reference to the second aspect, in a possible implementation manner, the receiving unit is further configured to receive, through a high-speed bus interface, the memory access request sent by a memory controller; or receive, through the chip interconnect interface, the memory access request sent by another memory chip.

With reference to the second aspect and the foregoing possible implementation manner, in another possible implementation manner, the memory chip further includes a processing unit configured to, after the receiving unit receives the memory access request, when the memory chip is the target memory chip corresponding to the memory access request, perform a memory access operation corresponding to the memory access request.

With reference to the second aspect and the foregoing possible implementation manners, in another possible implementation manner, the memory chip further includes a caching unit configured to, before the processing unit performs the memory access operation corresponding to the memory access request, when the memory chip is in a busy state, cache the memory access request received from the other memory chip; and a reading unit configured to, when the memory chip leaves the busy state, read the cached memory access request.

With reference to the second aspect and the foregoing possible implementation manners, in another possible implementation manner, the memory access request includes a data interaction instruction for instructing interaction between an interaction memory chip and the target memory chip and further indicating, and memory service data to be interacted between the interaction memory chip and the target memory chip; and the memory access operation corresponding to the memory access request comprising transmitting, according to the routing rule, the memory service data between the interaction memory chip and the target memory chip.

With reference to the second aspect and the foregoing possible implementation manners, in another possible implementation manner, the memory access request sent by the memory controller includes a primary memory access request received by the memory controller; and/or one of at least two secondary memory access requests that are divided from the primary memory access request.

According to a third aspect, an embodiment of the present disclosure provides a memory access processing system based on memory chip interconnection, which includes at least any two foregoing memory chips; and a memory controller, where the memory controller is configured to receive a primary memory access request sent by a processor; and send the primary memory access request to a memory chip that is not in a busy state.

With reference to the third aspect, in a possible implementation manner, the memory controller is further configured to divide the primary memory access request into a number of secondary memory access requests; the number of the divided secondary memory access requests is equal to the number of the memory chips, connected with the memory controller, that is not in a busy state and distribute the divided secondary access memory access requests to the memory chip, connected with the memory controller, that is not in a busy state, respectively.

For the memory access processing method based on memory chip interconnection, memory chip, and system provided by the embodiments of the present disclosure, after a memory chip receives a memory access request, the memory access request may be sent, according to a preconfigured routing rule and through a chip interconnect interface, to a target memory chip corresponding to the memory access request; compared with a technology in the related art in which a memory access request sent by a memory controller can be received only after a target memory chip completes a current memory access operation, a memory controller can send a memory access request to a memory chip regardless whether a target memory chip is busy, and through forwarding between memory chips, the target memory chip can quickly obtain the memory access request, which can shorten a time delay of transmission in obtaining data from the memory controller and reduce a waste of system bandwidth in a data waiting process, so that a time delay in processing a memory access request can be shortened, and a utilization rate of system bandwidth can be improved.

BRIEF DESCRIPTION OF DRAWINGS

To describe the technical solutions in the embodiments of the present disclosure or in the related art more clearly, the following briefly introduces the accompanying drawings required for describing the embodiments or the related art. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are merely a part rather than all of the embodiments of the present disclosure. All other embodiments obtained by a person of ordinary skill in the art based on the embodiments of the present disclosure without creative efforts shall fall within the protection scope of the present disclosure.

Embodiment 1

Figure 1:
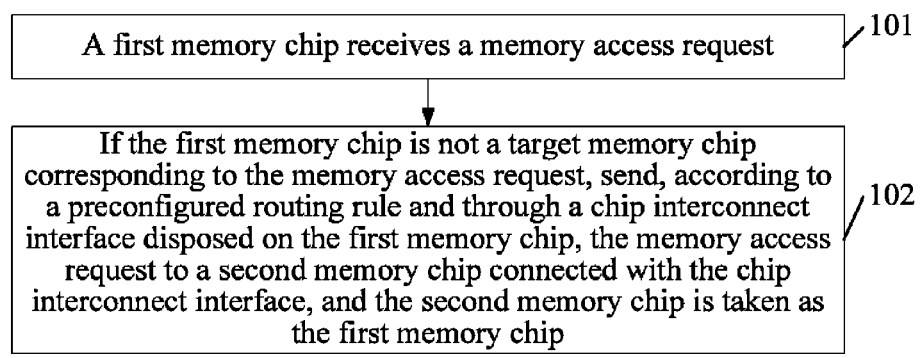
FIG. 1 is a flowchart of a memory access processing method based on memory chip interconnection according to Embodiment 1 of the present disclosure.

This embodiment of the present disclosure provides a memory access processing method based on memory chip interconnection, as shown in FIG. 1, including the following steps.

101: A first memory chip receives a memory access request.

That a first memory chip receives a memory access request may include receiving, through a high-speed bus interface, the memory access request sent by a memory controller; or, receiving, through a chip interconnect interface, the memory access request sent by a second memory chip. The memory access request may be a primary memory access request received by the memory controller; and may also be one of at least two secondary memory access requests divided from the primary memory access request.

102: If the first memory chip is not a target memory chip corresponding to the memory access request, the first memory chip sends, according to a preconfigured routing rule and through a chip interconnect interface disposed on the first memory chip, the memory access request to a second memory chip connected with the chip interconnect interface, and the second memory chip is taken as the first memory chip. The steps 101 and 102 are repeated until it is determined that the first memory chip is the target memory chip.

After receiving the memory access request, the first memory chip may determine, using a routing function of the first memory chip, whether the first memory chip is a target memory chip corresponding to the memory access request according to target memory chip address information carried in the memory access request; and if the first memory chip is not a target memory chip corresponding to the memory access request, the memory access request is sent by the first memory chip, according to a preconfigured routing rule and through a chip interconnect interface disposed on the first memory chip, to a second memory chip connected with the chip interconnect interface.

For the memory access processing method based on memory chip interconnection provided by this embodiment of the present disclosure, after receiving a memory access request, a memory chip may send the memory access request, according to a preconfigured routing rule and through a chip interconnect interface disposed on the memory chip, to a next memory chip connected with the chip interconnect interface, the next memory chip performs the same functions as the memory chip, until the memory access request is sent to a target memory chip corresponding to the memory access request. Compared with a technology of the related art in which a memory access request sent by a memory controller can be received only after a target memory chip completes a current memory access operation, the memory controller can send a memory access request to a memory chip regardless whether a target memory chip is busy, and the target memory chip can quickly obtain the memory access request through forwarding the memory access request between memory chips, which can shorten a transmission time delay for obtaining data from the memory controller and reduce a waste of memory bandwidth during a data waiting process, thereby shortening a time delay for processing a memory access request and improving a utilization rate of a memory bandwidth.

Embodiment 2

This embodiment of the present disclosure provides a memory access processing method based on memory chip interconnection, including the following steps.

201: A memory controller receives a primary memory access request sent by a processor.

The memory controller may receive a memory access request sent by the processor, and distribute the memory access request to at least one memory chip controlled by the memory controller. Meanwhile, the memory controller may further receive response data returned by the memory chip, combine the response data, and send the combined response data to the processor.

202: The memory controller sends the primary memory access request to a memory chip that is not in a busy state according to a preconfigured routing rule.

A specific implementation method that the memory controller sends the primary memory access request as the memory access request to a memory chip that is not in a busy state is that the memory controller may perform address mapping for the memory access request according to target memory chip address information corresponding to the memory access request carried in the memory access request, to determine a target memory chip corresponding to the memory access request, and then determine whether the target memory chip is in a busy state according to working state (for example, an idle state or a busy state) of memory chips backed up in the memory controller; if the target memory chip is not in a busy state, the memory controller directly sends the memory access request to the target memory chip; or if the target memory chip is in a busy state, the memory controller selects one of the memory chips in the idle state according to a preconfigured routing rule to send the memory access request to the selected memory chip.

Further, optionally, in an application scenario of this embodiment, to flexibly configure an access data granularity on the memory chip, step 202 may be replaced with 202a: the memory controller divides the primary memory access request into at least two secondary memory access requests; and 202b: the memory controller distributes the at least two secondary access memory access requests to at least two memory chips that are not in a busy state, respectively.

A specific implementation method that the memory controller divides the primary memory access request into at least two secondary memory access requests and distributes the at least two secondary access memory access requests to the at least two memory chips that are not in a busy state may include that, if the memory access request is an urgent request and the target memory chip is in a busy state, the memory controller selects at least two memory chips, connected with the memory controller, that are not in a busy state, divides the primary memory access request into the same number of secondary memory access requests with the selected memory chips, and distribute the divided secondary access memory access requests to the selected memory chips, respectively. For example, when the memory controller receives one urgent memory access request A sent by the processor, the memory controller may perform address mapping according to target memory chip address information corresponding to the memory access request carried in the urgent memory access request A, and determine whether the target memory chip is in a busy state, if the target memory chip is in a busy state, select at least one memory chips, connected with the memory controller, that are not in a busy state, divide the urgent memory access request A into the same number of secondary memory access requests with the selected memory chips, and distribute the secondary access memory access requests to the selected memory chips t, respectively. The memory controller may determine the number of the secondary memory access requests that the memory access request A is to be divided into according to the number of the memory chips, connected with the memory controller, in an idle state in a memory module. For example, when there are only two memory chips, connected with the memory controller, in an idle state in the memory module, the memory controller may divide the memory access request A into two secondary memory access requests, and distributes the two divided secondary access requests to the two memory chips in an idle state, respectively.

It should be noted that, the method and condition for the memory controller to divide the primary memory access request into at least two secondary memory access requests include, but are not limited to, the method and condition provided in this embodiment of the present disclosure. Other methods and conditions for dividing the primary memory access request are not elaborated in this embodiment of the present disclosure.

Figure 2:
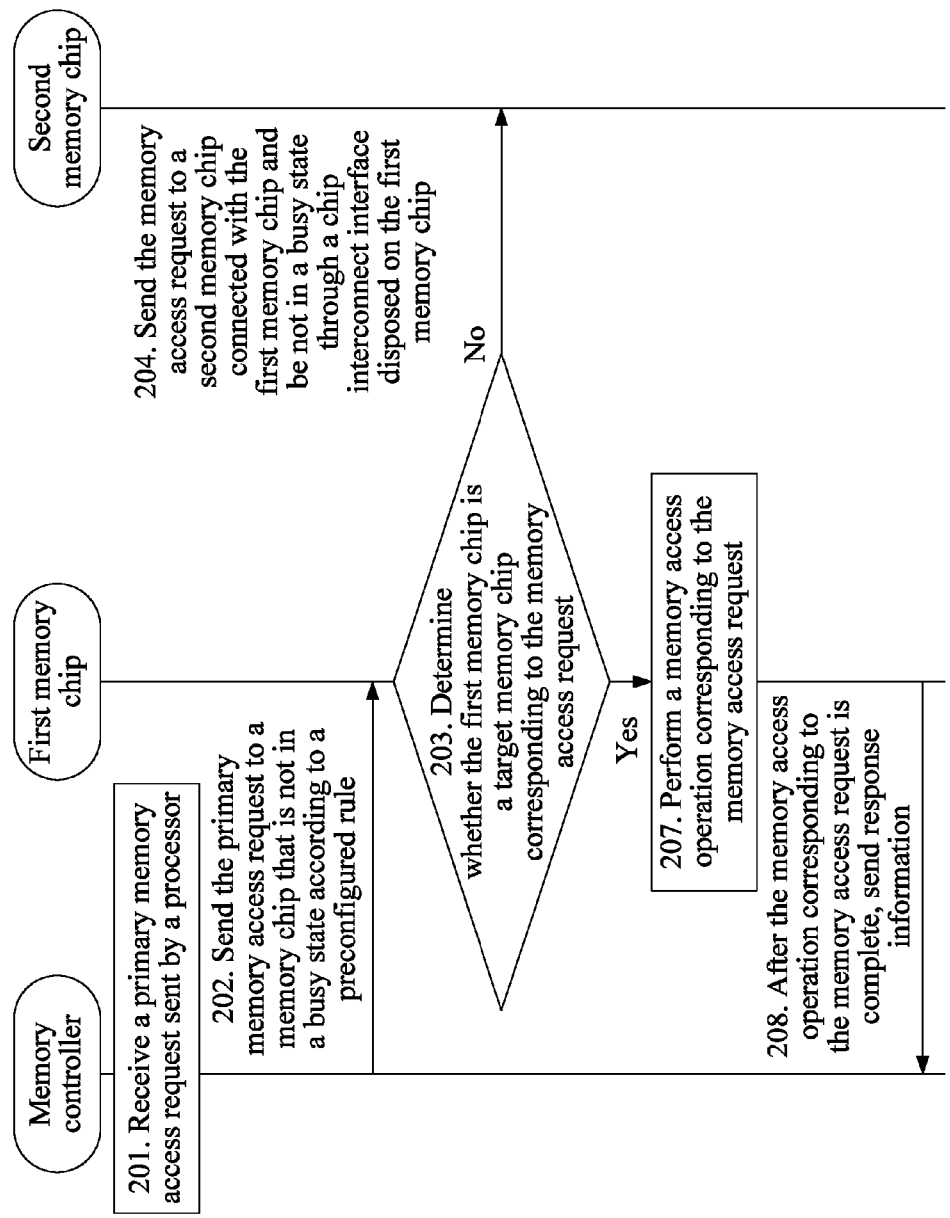
FIG. 2 is a flowchart of a memory access processing method based on memory chip interconnection according to Embodiment 2 of the present disclosure.

Further, optionally, in an application scenario of this embodiment, as shown in FIG. 2, when the first memory chip is not in a busy state, the first memory chip may receive the memory access request sent by the memory controller. Because the first memory chip may query a routing table of the first memory chip according to a target address in the memory access request to determine whether the memory chip is the target memory chip corresponding to the memory access request when receiving the memory access request, the method in this embodiment may further include the following steps.

203: Determine whether the first memory chip is a target memory chip corresponding to the memory access request. If the first memory chip is not a target memory chip corresponding to the memory access request, perform step 204. If the first memory chip is the target memory chip corresponding to the memory access request, perform step 207.

In this embodiment, when a memory chip receives the memory access request, regardless whether the memory access request is received from the memory controller or from another memory chip, the memory chip should determine whether the memory chip is a target memory chip corresponding to the memory access request; and if the memory chip is not the target memory chip corresponding to the memory access request, the memory chip selects an optimal path according to a preconfigured routing rule to send the memory access request to a next memory chip (that is, one of the other memory chips that are directly connected with the memory chip) through a chip interconnect interface, the process is repeated until the memory access request is sent to the target memory chip corresponding to the memory access request; or if the memory chip is the target memory chip corresponding to the memory access request, performs a memory access operation corresponding to the memory access request.

204: The first memory chip sends, according to a preconfigured routing rule, the memory access request to a second memory chip connected with the first memory chip and not be in a busy state through a chip interconnect interface disposed on the first memory chip.

At least one chip interconnect interface is disposed on the first memory chip, and each chip interconnect interface is connected to a second memory chip. At least one chip interconnect interface connected to a subarray on the memory chip may further be disposed on the first memory chip, and the memory chip may send, through a chip interconnect interface, a memory access request received from the memory controller or another memory chip to a corresponding subarray.

Figure 3:
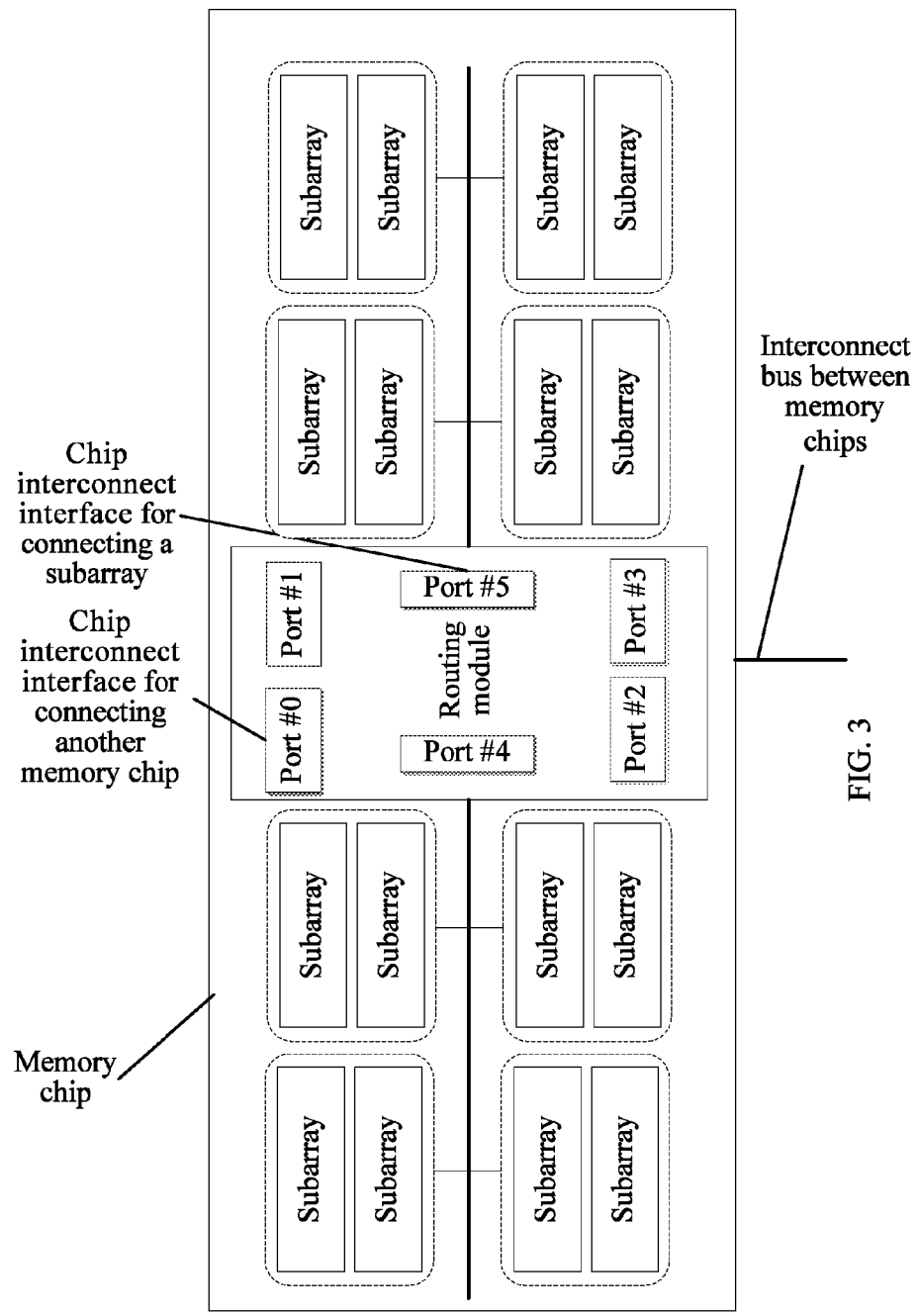
FIG. 3 is a schematic structural diagram of a memory chip according to Embodiment 2 of the present disclosure.

After the memory chip receives the memory access request from the memory controller or another memory chip, a routing module of the memory chip determines whether the memory chip is the target memory chip corresponding to the memory access request. If the memory chip is the target memory chip corresponding to the memory access request, the routing module of the memory chip may send, through the chip interconnect interface connecting with the subarray, the memory access request to the corresponding subarray. If the memory chip is not the target memory chip corresponding to the memory access request, the routing module of the memory chip may send, through a chip interconnect interface connecting with another memory chip, the memory access request to the target memory chip corresponding to the memory access request. On the memory chip shown in FIG. 3, four chip interconnect interfaces Port #0, Port #1, Port #2, and Port #3 for connecting other memory chips and two chips interconnect interfaces Port #4 and Port #5 for connecting subarrays are disposed.

Figure 4:
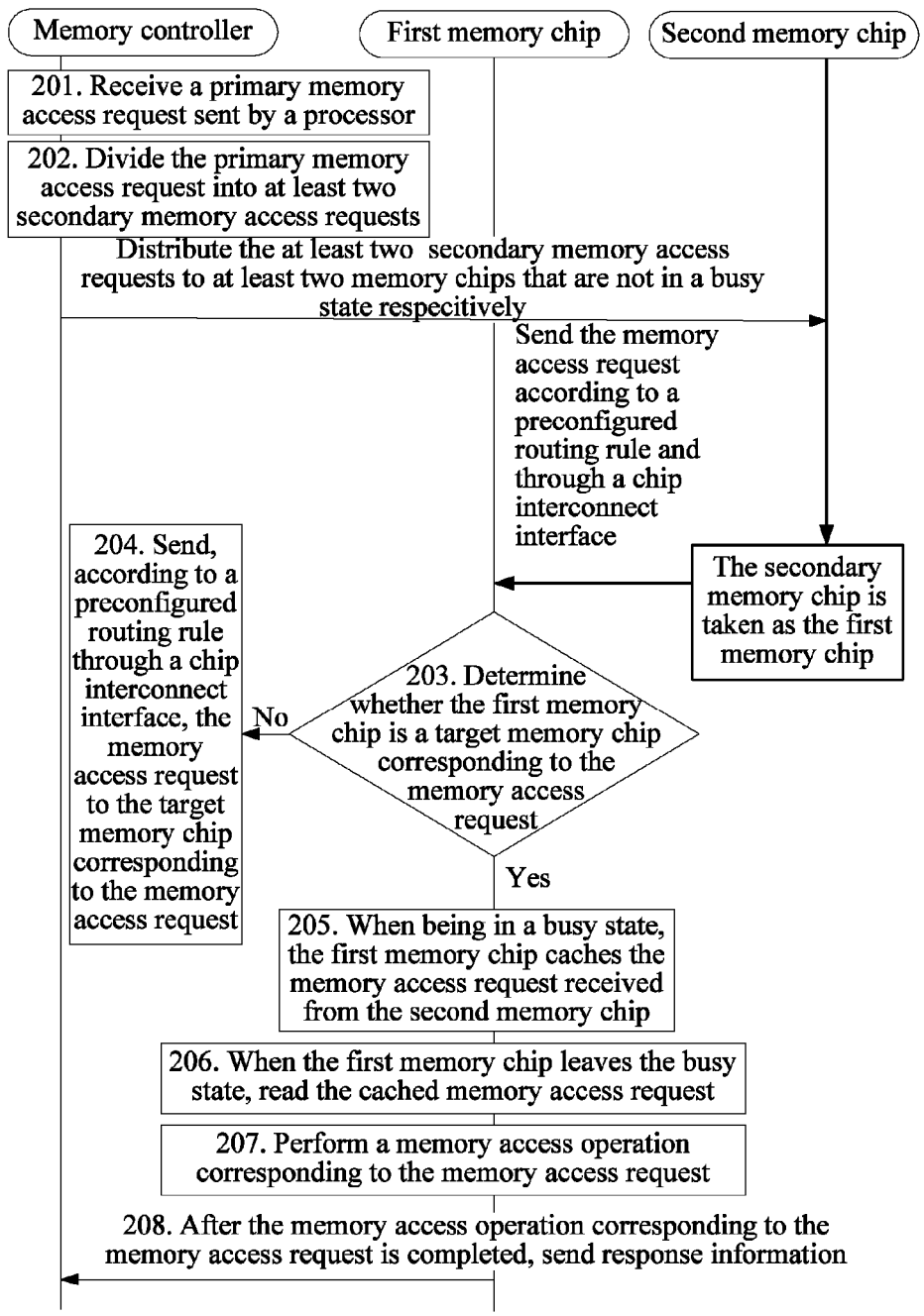
FIG. 4 is a flowchart of another memory access processing method based on memory chip interconnection according to Embodiment 2 of the present disclosure.

It should be noted that the memory chips are connected through chip interconnect interfaces to form a network among the memory chips. Because not every two memory chips are connected, the memory access request, which is sent to the target memory chip corresponding to the memory access request through the chip interconnect interface according to the preconfigured routing rule, is forwarded at least once by the memory chip. Further, optionally, in another application scenario of this embodiment, as shown in FIG. 4, when the first memory chip is in a busy state and the first memory chip is the target memory chip of the memory access request, the memory controller may send the memory access request to the second memory chip that is not in a busy state, and the second memory chip may forward, according to the configured routing rule and through the chip interconnect interface, the memory access request to the target memory chip. Because when receiving the memory access request forwarded by the second memory chip, the target memory chip has not completed the memory access operation corresponding to the current memory access request, the method in this embodiment may further include the following steps.

205: When being in a busy state, the first memory chip caches the memory access request received from the second memory chip.

When the first memory chip receives the memory access request sent by the second memory chip, if the memory access operation corresponding to the current memory access request of the first memory chip is still in progress, that is, the first memory chip is in a busy state, the first memory chip may cache the memory access request, and process the memory access request after the first memory chip completes the memory access operation corresponding to the current memory access request.

206: When leaving from the busy state, the first memory chip reads the cached memory access request.

Because the first memory chip may cache at least one memory access request, when completing the memory access operation corresponding to the current memory access, namely leaving from the busy state, the first memory chip may first read a memory access request with a higher urgency level according to the urgency level of the cached memory access request. The memory access request may carry information about an urgency level of the memory access request. The method for reading the cached memory access request is not limited to the foregoing method. The cached memory access request may also be read according to a caching ordering of the memory access request.

207: The first memory chip performs a memory access operation corresponding to the memory access request.

After reading the cached memory access request, the first memory chip may perform the memory access operation corresponding to the memory access request that is read from the cache.

Further, in an application scenario of this embodiment, the performing the memory access operation corresponding to the memory access request that is read from the cache may include, if the first memory chip is the target memory chip corresponding to the memory access request, performing the memory access operation corresponding to the memory access request. In such application scenario, step 204, step 205, and step 206 do not need to be performed, and the memory access operation corresponding to the memory access request is directly performed. After the first memory chip receives the memory access request sent by the memory controller through a high-speed bus interface, if the first memory chip is the target memory chip corresponding to the memory access request, the memory access operation corresponding to the memory access request is performed.

That the first memory chip performs the memory access operation corresponding to the memory access request may be that at least one subarray in the first memory chip performs the memory access operation corresponding to the memory access request.

The memory access request may include a data interaction instruction for instructing interaction between an interaction memory chip and the target memory chip and further indicating memory service data to be interacted between the interaction memory chip and the target memory chip. In this condition, the performing the memory access operation corresponding to the memory access request includes transmitting, according to a routing rule, the memory service data indicated by the data interaction instruction between the interaction memory chip and the target memory chip. The data interaction instruction may include a data migration instruction, a data copy instruction, and the like. For example, when memory service data a in a memory chip A (target memory chip) needs to be migrated to a memory chip B (interaction memory chip), the memory controller only needs to send a piece of data migration instruction to the memory chip A, and the memory chip A sends, according to the data migration instruction, the memory service data a to the memory chip B, and thus, the migration of the memory service data may be completed without transmitting through the memory controller, namely, the memory service data a need not be sent to the memory controller by the memory chip A and then sent to the memory chip B by the memory controller.

Further, to further shorten a time delay caused in processing the memory access, the method in this embodiment may include step 208.

208: After completing the memory access operation corresponding to the memory access request, the target memory chip sends response information to the memory controller to trigger the memory controller to send another memory access request.

The response information may indicate that the memory access operation corresponding to the memory access request is completed. Corresponding to step 202, namely the memory controller divides the primary memory access request into at least two secondary memory access requests, and distributes the at least two divided secondary memory access requests to the memory chips that are not in a busy state respectively, the method may further include that after completing a memory access operation corresponding to the secondary memory access requests on the target memory chip, the target memory chip send different response information corresponding to different secondary memory access requests through the routing rule that each secondary memory access request is sent to the target memory chip to the memory controller and the memory controller combines the response information corresponding to the secondary memory access requests.

It should be noted that, in the method provided in this embodiment, a memory chip network formed between the memory chips in the memory module using interconnect interfaces may be heterogeneous, that is, the memory chip network may include memory chips of multiple types of materials. For example, the memory chips may include a dynamic random access memory (DRAM) chip and a non-volatile memory chip. The memory chips of different materials have respective characteristics in aspects such as a capacity, a delay, a bandwidth, and power consumption.

For the memory access processing method based on memory chip interconnection provided by this embodiment of the present disclosure, after a memory chip receives a memory access request, the memory access request may be sent, according to a preconfigured routing rule and through a chip interconnect interface, to a target memory chip corresponding to the memory access request; compared with a technology in the related art in which a memory access request sent by a memory controller can be received only after a target memory chip completes a current memory access operation, a memory controller can send a memory access request to a memory chip regardless whether a target memory chip is busy, and through forwarding the memory access request between memory chips, the target memory chip can quickly obtain the memory access request, which can shorten a time delay of transmission in obtaining data from the memory controller and reduce a waste of system bandwidth in a data waiting process, so that a time delay in processing a memory access request is shortened, and utilization rate of system bandwidth is improved.

Moreover, when the memory access request includes a data interaction instruction for instructing interaction between a interaction memory chip and the target memory chip, memory service data indicated by the data interaction instruction may be transmitted between the interaction memory chip and the target memory chip, to implement data transmission between memory chips, thereby reducing data interaction between the memory chips and the memory controller through a high-speed bus interface, and further shortening the time delay in processing a memory access request.

Embodiment 3

Figure 5:
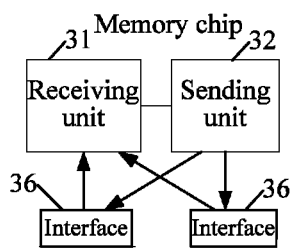
FIG. 5 is a schematic structure diagram of a memory chip according to Embodiment 3 of the present disclosure.

This embodiment of the present disclosure provides a memory chip, as shown in FIG. 5, including a receiving unit 31, a sending unit 32, and at least one chip interconnect interface 36.

The receiving unit 31 is configured to receive a memory access request.

The chip interconnect interface 36 is configured to be connected to another memory chip.

The sending unit 32 is configured to send, according to a preconfigured routing rule and through a chip interconnect interface, the memory access request to another memory chip connected with the chip interconnect interface 36 of the memory chip when the memory chip is not a target memory chip corresponding to the memory access request received by the receiving unit 31.

Figure 6:
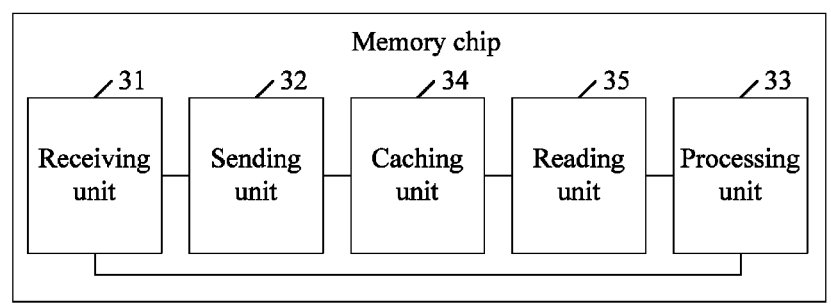
FIG. 6 is a schematic structure diagram of another memory chip according to Embodiment 3 of the present disclosure.

Further, as shown in FIG. 6, the receiving unit 31 may be configured to receive, through a high-speed bus interface, the memory access request sent by a memory controller; or receive, through the chip interconnect interface, the memory access request sent by another memory chip.

Further, the memory unit may include a processing unit 33.

The processing unit 33 is configured to, after the receiving unit 31 receives the memory access request and when the memory chip is the target memory chip corresponding to the memory access request, perform a memory access operation corresponding to the memory access request.

Further, the memory unit may include a caching unit 34 and a reading unit 35.

The caching unit 34 is configured to cache the memory access request received from the other memory chip before the processing unit 33 performs the memory access operation corresponding to the memory access request and when the memory chip is in a busy state.

The reading unit 35 is configured to read the cached memory access request when the memory chip is not in the busy state.

Further, the memory access request includes a data interaction instruction and memory service data.

If the memory access request includes a data interaction instruction for instructing interaction between an interaction memory chip and the target memory chip and further indicating memory service data to be interacted between the interaction memory chip and the target memory chip, the processing unit 33 may further be configured to transmit, according to the routing rule, memory service data indicated by the data interaction instruction between the interaction memory chip and the target memory chip.

Further, the memory access request sent by the memory controller includes a primary memory access request received by the memory controller; and/or one of at least two secondary memory access requests is divided from the primary memory access request.

It should be noted that, for specific descriptions of a part of functional modules in the memory chip provided by this embodiment of the present disclosure, reference may be made to corresponding content in the method embodiments, and details are not provided again in this embodiment.

For the memory chip provided by the embodiment of the present disclosure, after a memory access request is received, the memory access request may be sent, according to a preconfigured routing rule and through a chip interconnect interface, to a target memory chip corresponding to the memory access request. Compared with a technology in the related art in which a memory access request sent by a memory controller can be received only after a target memory chip completes a current memory access operation, a memory controller can send a memory access request to a memory chip regardless whether a target memory chip is busy, and the target memory chip can quickly obtain the memory access request through forwarding the memory access request between memory chips, which can shorten a transmission time delay when obtaining data from the memory controller and reduce system bandwidth waste when the data is waiting for processing, thereby shortening a time delay for processing a memory access request, and improving an utilization rate of system bandwidth.

Embodiment 4

Figure 7:
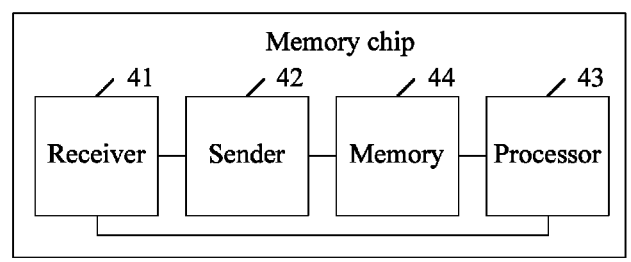
FIG. 7 is a schematic structure diagram of a memory chip according to Embodiment 4 of the present disclosure.

This embodiment of the present disclosure provides a memory chip, as shown in FIG. 7, including a receiver 41, a sender 42. Each memory chip disposes at least one chip interconnect interface (not shown) configured for connecting with another memory chip.

The receiver 41 is configured to receive a memory access request.

The sender 42 is configured to send, according to a preconfigured routing rule and through a chip interconnect interface, the memory access request to the target memory chip corresponding to the memory access request when the memory chip is not a target memory chip corresponding to the memory access request.

Further, the receiver 41 may be configured to receive, through a high-speed bus interface, the memory access request sent by a memory controller; or receive, through the chip interconnect interface, the memory access request sent by another memory chip.

Further, the memory chip may include a processor 43.

The processor 43 is configured to perform a memory access operation corresponding to the memory access request after the receiver 41 receives the memory access request and when the memory chip is the target memory chip corresponding to the memory access request.

Further, the memory chip may include a memory 44.

The memory 44 is configured to cache the memory access request received from the other memory chip before the processor 43 performs the memory access operation corresponding to the memory access request and when the first memory chip is in a busy state.

The processor 43 is further configured to read the cached memory access request when the memory chip leaves the busy state.

Further, the memory access request includes a data interaction instruction for instructing interaction between an interaction memory chip and the target memory chip and further indicating memory service data to be interacted between the interaction memory chip and the target memory chip.

If the memory access request includes the data interaction instruction, the sender is further configured to transmit, according to the routing rule, the memory service data indicated by the data interaction instruction between the target memory chip and the interaction memory chip.

Further, the memory access request sent by the memory controller includes a primary memory access request received by the memory controller; and/or one of at least two secondary memory access requests divided according to the primary memory access request.

It should be noted that, for specific descriptions of a part of functional modules in the memory chip provided by this embodiment of the present disclosure, reference may be made to corresponding content in other embodiments, and details are not provided again herein in this embodiment.

For the memory chip provided by the embodiment of the present disclosure, after a memory access request is received, the memory access request may be sent, according to a preconfigured routing rule and through a chip interconnect interface, to a target memory chip corresponding to the memory access request. Compared with a technology of the related art in which a memory access request sent by a memory controller can be received only after a target memory chip completes a current memory access operation, a memory controller can send a memory access request to a memory chip regardless whether a target memory chip is busy, and the target memory chip can quickly obtain the memory access request through forwarding the memory access request between memory chips, which can shorten a transmission time delay when obtaining data from the memory controller and reduce a system bandwidth waste when the data is waiting for processing, thereby shortening a time delay for processing a memory access request, and improving an utilization rate of system bandwidth.

Embodiment 5

Figure 8:
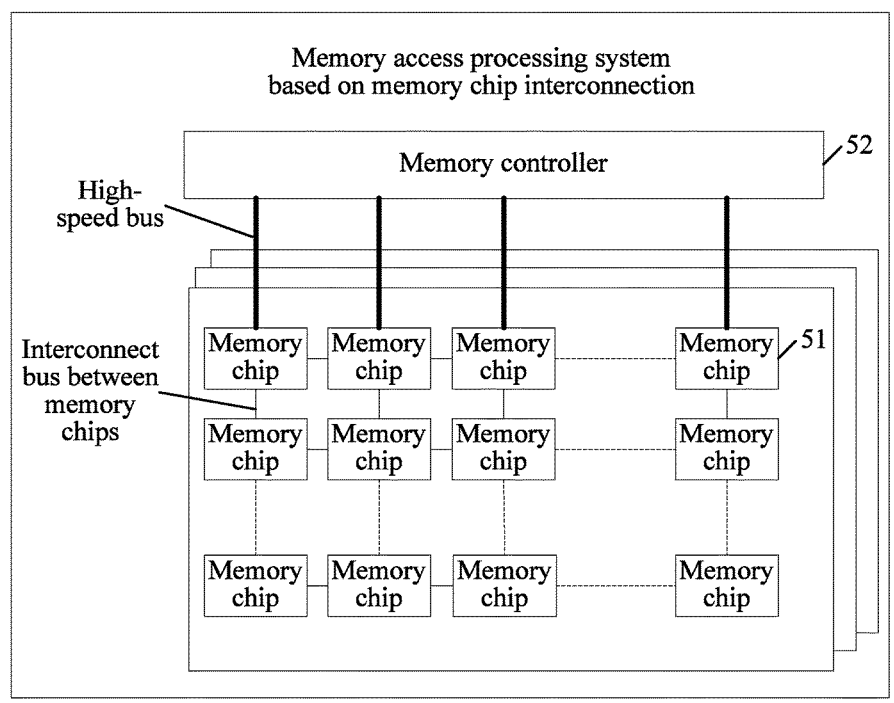
FIG. 8 is a schematic structure diagram of a memory access processing system based on memory chip interconnection according to Embodiment 5 of the present disclosure.

This embodiment of the present disclosure provides a memory access processing system based on memory chip interconnection, as shown in FIG. 8, including a number of memory chips 51 and a memory controller 52.

The memory chip 51 is configured to receive a memory access request; and send, according to a preconfigured routing rule and through a chip interconnect interface, the memory access request to another memory chip connected with the memory chip through the chip interconnect interface disposed on the memory chip if the memory chip is not a target memory chip corresponding to the memory access request. The memory controller 52 is configured to receive a primary memory access request sent by a processor; and send the primary memory access request as the memory access request to a memory chip that is not in a busy state.

Further, the memory controller 52 is configured to divide the primary memory access request into at least two secondary memory access requests; and distribute the secondary memory access requests to the memory chips that are not in a busy state.

It should be noted that, for specific descriptions of the memory chip 51 and the memory controller 52 in the memory access processing system based on memory chip interconnection provided by this embodiment of the present disclosure, reference may be made to corresponding content in other embodiments, and details are not provided again herein in this embodiment.

For the memory access processing system based on memory chip interconnection provided by the embodiment of the present disclosure, after a memory chip receives a memory access request, the memory access request may be sent, according to a preconfigured routing rule and through a chip interconnect interface, to a target memory chip corresponding to the memory access request. Compared with a technology in the related art in which a memory access request sent by a memory controller can be received only after a target memory chip completes a current memory access operation, a memory controller can send a memory access request to a memory chip regardless whether a target memory chip is busy, and the target memory chip can quickly obtain the memory access request through forwarding the memory access request between memory chips, which can shorten a transmission time delay when obtaining data from the memory controller and reduce a system bandwidth waste the data is waiting for processing, thereby shortening a time delay for processing a memory access request, and improving an utilization rate of system bandwidth.

Based on the foregoing descriptions of the implementation manners, a person skilled in the art may clearly understand that the present disclosure may be implemented by software in addition to necessary universal hardware or by hardware only. In most circumstances, the former is a preferred implementation manner. Based on such an understanding, the technical solutions of the present disclosure essentially or the part contributing to the prior art may be implemented in a form of a software product. The software product is stored in a readable storage medium, such as a floppy disk, a hard disk or an optical disc of a computer, and includes several instructions for instructing a computer device (which may be a personal computer, a server, or a network device) to perform the methods described in the embodiments of the present disclosure.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A memory access processing method based on memory chip interconnection, comprising:
    receiving, by a first memory chip, a memory access request that carries an indication of an urgency level;
    sending, by the first memory chip according to a preconfigured routing rule and through a chip interconnect interface disposed on the first memory chip, the memory access request to a second memory chip connected with the chip interconnect interface when the first memory chip is not a target memory chip corresponding to the memory access request;
    dividing, by the second memory chip, the memory access request into at least two secondary memory access requests;
    sending, by the second memory chip, the at least two secondary memory access requests to a third memory chip and a fourth memory chip when the target memory chip is in a busy state, wherein the third memory chip and the fourth memory chip are connected to the target memory chip and are in an idle state; and
    continuing to divide the at least two secondary memory access requests into additional secondary memory access requests until the target memory chip is in the idle state and receives one of the additional secondary memory access requests,
    wherein the second memory chip is taken as the first memory chip for implementing the process, until the target memory chip corresponding to the memory access request is determined,
    wherein the target memory chip comprises a cache of memory access requests, and
    wherein the target memory chip processes the memory access requests according to urgency levels associated with the memory access requests.

2. The memory access processing method based on the memory chip interconnection according to claim 1, wherein receiving, by the first memory chip, the memory access request comprises receiving, through a high-speed bus interface, the memory access request from a memory controller.

3. The memory access processing method based on the memory chip interconnection according to claim 1, wherein receiving, by the first memory chip, the memory access request comprises receiving, through the chip interconnect interface, the memory access request from the second memory chip.

4. The memory access processing method based on the memory chip interconnection according to claim 1, wherein after receiving, by the first memory chip, the memory access request, the method further comprises performing a memory access operation corresponding to the memory access request when the first memory chip is the target memory chip corresponding to the memory access request.

5. The memory access processing method based on the memory chip interconnection according to claim 4, wherein before performing the memory access operation corresponding to the memory access request, the method further comprises:

caching, by the first memory chip, the memory access request received from the second memory chip as a cached memory access request when the first memory chip is in the busy state; and reading, by the first memory chip, the cached memory access request when the first memory chip leaves the busy state.

6. The memory access processing method based on the memory chip interconnection according to claim 4, wherein the memory access request comprises a data interaction instruction for instructing interaction between an interaction memory chip and the target memory chip, wherein the memory access request indicates memory service data to be interacted between the interaction memory chip and the target memory chip, and wherein performing the memory access operation corresponding to the memory access request comprises transmitting, according to the preconfigured routing rule, the memory service data indicated by the data interaction instruction between the interaction memory chip and the target memory chip.

7. The memory access processing method based on the memory chip interconnection according to claim 2, wherein the memory access request from the memory controller comprises a primary memory access request received by the memory controller and/or one of the at least two secondary memory access requests that are divided from the primary memory access request.

8. A memory chip, comprising:
a receiver configured to receive a memory access request that carries an indication of an urgency level;
at least one chip interconnect interface coupled to the receiver and configured to be coupled to a second memory chip; and
a transmitter coupled to the at least one chip interconnect interface and configured to:
send, according to a preconfigured routing rule and through a chip interconnect interface, the memory access request to the second memory chip connected with the chip interconnect interface when the memory chip is not a target memory chip corresponding to the memory access request;
divide the memory access request into at least two secondary memory access requests;
send the at least two secondary memory access requests to a third memory chip and a fourth memory chip when the target memory chip is in a busy state, wherein the third memory chip and the fourth memory chip are connected to the target memory chip and are in an idle state; and
continue to divide the at least two secondary memory access requests into additional secondary memory access requests until the target memory chip is in the idle state and receives one of the additional secondary memory access requests,
wherein the target memory chip comprises a cache of memory access requests, and
wherein the target memory chip processes the memory access requests according to urgency levels associated with the memory access requests.

9. The memory chip according to claim 8, wherein the receiver is further configured to receive, through a high-speed bus interface, the memory access request from a memory controller.

10. The memory chip according to claim 8, wherein the receiver is further configured to receive, through the chip interconnect interface, the memory access request from the second memory chip.

11. The memory chip according to claim 8, further comprising a processor configured to perform a memory access operation corresponding to the memory access request after the receiver receives the memory access request and when the memory chip is the target memory chip corresponding to the memory access request.

12. The memory chip according to claim 11, wherein the cache is configured to cache the memory access request received from the other memory chip before the processor performs the memory access operation corresponding to the memory access request and when the memory chip is in the busy state, and wherein the processor is configured to read the cached memory access request when the memory chip leaves the busy state.

13. The memory chip according to claim 11, wherein the memory access request comprises a data interaction instruction for instructing interaction between an interaction memory chip and the target memory chip, wherein the memory access request indicates memory service data to be interacted between the interaction memory chip and the target memory chip, and wherein the memory access operation corresponding to the memory access request comprises transmitting, according to the preconfigured routing rule, the memory service data between the interaction memory chip and the target memory chip.

14. The memory chip according to claim 9, wherein the memory access request from the memory controller comprises a primary memory access request received by the memory controller and/or one of the at least two secondary memory access requests that are divided from the primary memory access request.

15. A memory access processing system based on memory chip interconnection, comprising:
a first memory chip; and
a second memory chip coupled to the first memory chip, wherein each of the first memory chip and the second memory chip comprises:
a receiver configured to receive a memory access request that carries an indication of an urgency level;
at least one chip interconnect interface configured to be connected to a third memory chip and a fourth memory chip; and
a transmitter coupled to the at least one chip interconnect interface and configured to send, according to a preconfigured routing rule and through a chip interconnect interface, the memory access request to the third memory chip and the fourth memory chip connected with the chip interconnect interface when the first memory chip and the second memory chip are not target memory chips corresponding to the memory access request, wherein the target memory chip comprises a cache of memory access requests, and wherein the target memory chip processes the memory access requests according to urgency levels associated with the memory access requests; and
a memory controller coupled to the first memory chip, the second memory chip, the third memory chip, and the fourth memory chip, wherein the memory controller is configured to:
receive a primary memory access request from a processor;

send the primary memory access request to at least one of the first memory chip and the second memory chip that is not in a busy state;

divide the primary memory access request into at least two secondary memory access requests;

send the at least two secondary memory access requests to the third memory chip and the fourth memory chip when the target memory chip is in the busy state, wherein the third memory chip and the fourth memory chip are connected to the target memory chip and are in an idle state; and continue to divide the at least two secondary memory access requests into additional secondary memory access requests until the target memory chip is in the idle state and receives one of the additional secondary memory access requests.

16. The memory access processing method based on the memory chip interconnection according to claim 1, wherein each of the first memory chip, the second memory chip, the third memory chip, and the fourth memory chip comprises a dynamic random-access memory (DRAM) chip.

17. The memory chip according to claim 8, wherein each of the first memory chip, the second memory chip, the third memory chin, and the fourth memory chip comprises a dynamic random-access memory (DRAM) chip.

18. The memory access processing system based on the memory chip interconnection according to claim 15, wherein each of the first memory chip, the second memory chip, the third memory chip, and the fourth memory chip comprises a dynamic random-access memory (DRAM) chip.

* * * * *